United States Patent [19]

Edgar

[11] Patent Number: 5,440,709
[45] Date of Patent: Aug. 8, 1995

[54] APPARATUS AND METHOD FOR AN IMPROVED CONTENT ADDRESSABLE MEMORY USING A RANDOM ACCESS MEMORY TO GENERATE MATCH INFORMATION

[75] Inventor: Ron Edgar, Raymond, N.H.

[73] Assignee: Digital Equipment Corporation, Maynard, Mass.

[21] Appl. No.: 203,177

[22] Filed: Feb. 28, 1994

Related U.S. Application Data

[63] Continuation of Ser. No. 546,414, Jun. 29, 1990, Pat. No. 5,317,708.

[51] Int. Cl.⁶ .................... G06F 12/06; G11C 15/00
[52] U.S. Cl. .................. 395/401; 364/DIG. 1; 364/DIG. 2; 364/253; 364/243; 395/435; 365/49
[58] Field of Search ............. 364/DIG. 1, DIG. 2, 364/200 MS File, 900 MS File; 395/425, 400; 365/49, 189.07

[56] References Cited

U.S. PATENT DOCUMENTS

| | | | |
|---|---|---|---|
| 4,241,401 | 12/1980 | De Ward et al. | 395/400 |
| 4,852,059 | 7/1989 | Oates | 365/49 |
| 4,982,360 | 1/1991 | Johnson et al. | 395/425 |
| 5,010,516 | 4/1991 | Oates | 365/49 |
| 5,053,951 | 10/1991 | Nusinov et al. | 395/425 |
| 5,142,676 | 8/1992 | Fried et al. | 395/425 |

OTHER PUBLICATIONS

T. Ogura et al., "Content Addressable Memory LSI Technology and the Future", Japanese Electronic Communications Institute, vol. 69, No. 7, Jul. 1986, pp. 745–751.

Primary Examiner—Glenn Gossage
Assistant Examiner—Matthew M. Kim
Attorney, Agent, or Firm—Kenyon & Kenyon

[57] ABSTRACT

A content addressable memory, utilizing address recognition mechanism, comprising a Random Access Memory (RAM) including a plurality of data storage locations. Each of the data storage locations has a unique address. The content addressable memory operates to store a data entry comprising predetermined match information for at least a portion of a data entity. Each at least a portion of a data entity comprises the unique address of the respective data storage location. The RAM has an address port for input of at least a portion of a data entity as an address and an output for outputting the stored data entries. The RAM operates to fetch the data entry stored at the input address and to output the stored match information corresponding to the at least a portion of a data entity, in response to input of the at least a portion of a data entity as an address to the RAM. In a particular embodiment, the RAM comprises an array of n RAMs, wherein the at least a portion of a data entity is segmented into n slices. Each of the slices is used as an address to a respective one of said array of n RAMs.

37 Claims, 5 Drawing Sheets

APPARATUS AND METHOD FOR AN IMPROVED CONTENT ADDRESSABLE MEMORY USING A RANDOM ACCESS MEMORY TO GENERATE MATCH INFORMATION

CROSS-REFERENCES TO RELATED APPLICATIONS

This application is a continuation of U.S. patent application Ser. No. 07/546,414, filed on Jun. 29, 1990, now U.S. Pat. No. 5,317,708.

FIELD OF THE INVENTION

The invention relates to a content addressable memory and, more particularly, to a new and improved hardware model for a content addressable memory.

BACKGROUND OF THE INVENTION

Conventionally, in a computer system, a data entity is electronically stored at and fetched from a particular location in a memory system that is uniquely identified by an address. Irk such an address based system, data are accessed by inputting an address corresponding to the data to the memory system which then utilizes the address information to locate the data for output by the memory system.

A content-addressable memory is a memory system which stores and retrieves data based on its content rather than on an associated address. The memory is viewed as a representation of the information it contains rather than as a consecutive sequence of uniquely identified locations containing unrelated data. Content addressable memories may be used, for example, in set associative caches.

One particular application of a content addressable memory is to recognize a sparsely populated matrix, i.e., a small preselected set of data entities to be recognized from a large number of possible input data entities.

For example, a computer network using a 48-bit address to uniquely identify and address a component on the network can have any one of $2^{48}$ possible different addresses appear on an address bus coupling the components of the network. A node on the network intercoupling, for example, 64 components to the bus, would have to be able to recognize when one of the components is being addressed, i.e., to recognize a set of 64 specific addresses from the $2^{48}$ possible addresses.

A software content addressable memory can be achieved by the use of hashing algorithms which, for example, use software to process an input data entity to determine whether it is of interest. A software model is not desirable in many instances because it is generally slower in operation than a hardware model.

In the existing art, a hardware content addressable memory typically comprises a system of stored table data entries which are to be compared to the content of a data entity input to the memory system. Table entries are stored in a look-up table and are each compared with a data entity input to the memory system. A match signal indicates that the input data entity exists as a table entry in the look-up table.

An example of such a system is one in which a register is provided for each table entry and stores one table entry. Each register is coupled to a comparator. Each comparator is also coupled to a bus on which a data entity is input to the content addressable memory for comparison. The comparator operates to compare data of a particular table entry stored in its corresponding register, with a data entity input to the content addressable memory. If the data of the table entry contained in the register matches the input data entity, the comparator corresponding to the particular register will output a match signal indicating that the input data entity is in the content addressable memory. All of the comparators in the memory system are arranged in parallel to one another relative to the data entity input bus and thus receive the input data entity simultaneously.

Such a system is relatively slow in operation, when used with large input data entities, such as 48-bit data entities, because of the relative time it takes to compare large multiple bit numbers. In addition to being too slow, such systems, in certain applications, also tend to be too cumbersome due to the numerous comparators that may be required.

Thus, a need generally exists for a hardware content addressable memory which can quickly and accurately identify a sparsely populated matrix.

SUMMARY OF THE INVENTION

The present invention provides a fast, highly-reliable content addressable memory. Generally, the present invention comprises a RAM memory, the contents of which is retrievable based upon the substance or meaning of the contents. The RAM is arranged at initialization as a look-up table containing data entries which comprise match information indicating whether there is a match for an input data entity to be input as an address, to the RAM. The data entry is fetched by addressing the data storage location containing the data entry. The RAM will output the data entry which indicates correspondence between the input data entity and the content of the entry, i.e., whether or not a match exists. Thus, the information stored in the memory of the RAM is meaningfully associated with the input data entity used as an address to access the information contained therein.

In one particular implementation, a unique input data entity is used as an address for the RAM to access a unique one bit wide data storage location in the RAM containing a one bit wide data entry. The state of each one bit data location is initialized as either a "1" or a "0" indicating whether or not a match exists for the input data entity used as the RAM address, i.e., whether the input data entity is a data entity to be recognized within the sparsely populated matrix. Thus, the RAM output will comprise match information indicating correspondence between the input data entity and the one bit wide data entry contained in the memory.

As the need for a wider input data entity arises, for example, a 48-bit wide input data entity, the RAM size required for use in accordance with the present invention becomes cumbersome or not physically feasible. Thus, according to a feature of the present invention, when large data entities are to be recognized, a functional RAM of the content addressable memory may be effectively achieved using, for example, n relatively small RAMS connected in parallel.

In accordance with a feature of this implementation of the present invention, the input data entity is partitioned into n slices, each of the n slices representing an address to a particular one of the n smaller RAMs. For example, a 48-bit input data entity could be sliced into six bytes with each byte used to address one of six RAMs. At each data storage location addressed by each slice there is a data entry which the RAM outputs when addressed. The data entry comprises match information which indicates whether a match exists for the corresponding slice of the input data entity. All of the RAM outputs are ANDed to provide composite match information for the six RAMs.

Thus, for example, where one data entity is to be recognized, six RAMs are used, the output of each RAM must indicate a match has occurred to output a signal indicating a match, i.e., each slice of the input data entity which is the data entity to be recognized, must have been matched.

In this particular embodiment, where there is more than one data entity in the small preselected set of data entities to be recognized within the sparsely populated matrix, the above implementation must be modified to avoid false positive matches. These false positive matches might result because a one bit output from each of the RAMs does not indicate which data entity is being matched for each particular slice.

For example, a first slice, e.g., A, of a two-slice input data entity input into a first RAM may correspond to a first byte of one data entity to be recognized, e.g., AB, while a second slice, e.g. C, input to a second RAM may correspond to a second byte of a different data entity to be recognized, e.g., BC. Match information would nevertheless be output from each of the first and second RAMs even though the first and second slices correspond to different data entities to be recognized and together form an additional data entity, i.e., AC, which is not to be recognized. When the match information from each RAM are ANDed together, in this case each output would be a logic 1, the output from, e.g., an AND gate would indicate a match when in fact one would not exist.

When the data entity has been divided into slices, as in the above described embodiment, and where more than one data entity is to be recognized, it is necessary to coordinate the look-up of each slice such that the ANDing will indicate a match only when a match occurs at each RAM and match information corresponding to a particular set of slices corresponds to a particular data entity.

To that end, the present invention provides for recognition of more than one data entity by increasing the width of the data storage location such that each data storage location is at least as many bits wide as is necessary to uniquely identify each data entity to be recognized within the sparsely populated matrix.

In a preferred embodiment, at each data storage location there is one bit corresponding to each data entity to be recognized. The multiple bit output, i.e., when more than one data entity is to be recognized, is in the form of a mask signal. The mask signal may be a signal which indicates a logic 1 for each corresponding recognized slice of an input data entity or of an entire input data entity and which masks out the unmatched slices of input data entities or entire input data entities by designating data storage locations corresponding to unmatched data entities with a logic ∅. The particular bit which corresponds to a particular data entity to be recognized, will thus be set to a logic 1 only at the data location which is uniquely addressed by the particular data entity to be recognized. When the RAM is initialized each bit of each data location will be set at logic ∅ except for the bits which indicate a match for a particular data entity to be recognized from the sparsely populated matrix which will be set at logic 1. In such an embodiment, false positive matches will not occur.

For example, where an input data entity divided into two slices, e.g. A and C, is not to be recognized but the first slice, A, corresponds to a first slice of a data entity to be recognized, e.g., AB, and the second slice of the input data entity not to be recognized, i.e., C, corresponds to a second slice of a second data entity to be recognized, e.g., BC, the content addressable memory will correctly recognize the data entities to be recognized AB, and BC, but will not falsely recognize the input data entity not to be recognized, AC. When the first slice, A, is input as an address into a first RAM, the first RAM will output a logic 1 on a bit of the data entry within, the data location corresponding to the data entity to be recognized, AB. If then the second slice, C, is input into a second RAM, the second RAM will output a logic 1 on the bit of the data entry within the data location corresponding to the second data entity to be recognized, BC. However, the bit corresponding to the second data entity BC, is different from the bit corresponding to the first data entity AB. Thus, if the first slice A, does not correspond to the same data entity to be recognized as the second slice C, the one bit of the mask output from the first RAM, corresponding to the data entity AB, will be a logic 1 and the same one bit of the mask output from the second RAM, corresponding to the same data entity, AB, will be a logic ∅. When the match information corresponding to the data entity, AB, from each RAM, are ANDed together, i.e. when the logic 1 output from the first RAM on the bit corresponding to the data entity, AB is ANDed with logic ∅ output from the second RAM on the bit corresponding to tile data entity, AB, the result is a logic ∅. Thus, the composite match information output from the AND gate will not indicate a match at the bit corresponding to the data entity AB. Similarly, the one bit of the mask output from the first RAM, corresponding to the data entity BC, will be a logic ∅ and the same one bit of the mask output from the second RAM corresponding to the same data entity, BC, will be logic 1. When the match information output from each RAM corresponding to the data entity, BC, are ANDed together, i.e., the logic ∅ from the first RAM and the logic 1 from the second RAM each output on the bit corresponding to BC, the result is a logic ∅. Thus, the composite match information output from the AND gate will not indicate a match at the bit corresponding to the data entity BC. Accordingly, input of slices A and C does not result in a false match output.

For the content addressable memory to recognize, e.g., 64 different 48-bit data entities from a set of 2 possible input data entities, each data entry at each data location is 64 bits wide. Each data entry of each data location of each RAM corresponds to a preselected one of six slices of a data entity and to one of 28 possible numbers for that slice. Each one of the bits at each data location corresponds to a particular data entity to be recognized.

In the illustrated embodiment, an ANDing logic device comprises an array of 64 six-input AND gates. Thus, each particular bit of a 64-bit output of a RAM is coupled to one input of a particular one of the six input AND gates, each input of that AND gate corresponding to one of the six RAMs.

In another implementation, the functional RAM may be time-divided rather than physically-divided. Such an implementation conserves real estate by requiring only one RAM.

For example, the content addressable memory may comprise one RAM with each slice of the input data entity serially accessing a preselected segment of the RAM memory corresponding to the particular slice. Where, for example, the input data entity is 48 bits wide, a 2K RAM memory is logically divided into six segments. Each segment corresponds to one of the six bytes of the 48-bit input data entity and each segment has 256 data locations uniquely addressed by a one byte wide slice of the input data entity. Each one byte wide slice has 256 possible binary number variations. Each data location in the RAM contains a data entry of e.g. 64 bits, each bit corresponding to one of 64 data entities to be recognized. Each bit is uniquely related to one of the 64 data entities to be recognized. A bit at a data location will be set at logic 1 if the particular slice addressing the data entry matches the corresponding slice of a data entity to be recognized. The particular bit of the data entry showing the logic 1 indicates that the particular slice has matched a particular portion of a particular data input entity to be recognized. The data entry will comprise a mask signal having as many logic 1's as there are data entities having a slice that addresses the corresponding data location. Each data entry will have a logic $\emptyset$ which masks out data entities which do not correspond to the slice input to the RAM.

The segments of the RAM are serially addressed by the corresponding slices of an input data entity through a series of clock cycles. The data entry at the location of the addressed segment provides match information indicating if a match has occurred for a particular slice by setting the bit corresponding to the data entity to be recognized to a logic 1. Each RAM output comprises a mask signal, e.g., 64 bits wide, with each bit of the mask signal corresponding to one of the 64 data entities to be recognized.

The mask signals are serially output from the RAM through a logic device. The logic device sequentially ANDs, once per cycle, each data entry fetched by a slice of the input data entity by taking the data entry corresponding to the first slice output during a cycle $\emptyset$, ANDing it with the data entry corresponding to the second slice output during a cycle 1, which results in an ANDed signal. The data entry corresponding to the third slice output during a cycle 2 is then ANDed with the ANDed signal to form a new ANDed signal which is then ANDed with the data entry corresponding to the fourth slice, etc. until all of the data entries addressed by the slices of a data entity have been ANDed. Thus at the final cycle, a final ANDed signal will represent the cumulative ANDing together of all the match information fetched by the slices of the input data entity.

During a six-cycle clock period, i.e., cycles $\emptyset$–5, at which the mask signal is serially accessed for each slice of the input data entity, one per cycle, the logic device effectively ANDs all the data entries, i.e., all the mask signals. Thus, where the RAM is divided into six segments, a match will occur for a input data entity which is to be recognized when all six bits corresponding to the data entity to be recognized of each mask signal, one per cycle, match.

The output of the RAM is connected to an ANDing logic device comprising a feedback loop which iterates the cyclical output of the RAM. The logic device only outputs a signal indicating a match on a particular bit where a match occurs for each slice of the input data entity. The above-described embodiment will iterate through as many cycles as there are slices of the input data entity.

DETAILED DESCRIPTION

Figure 1:
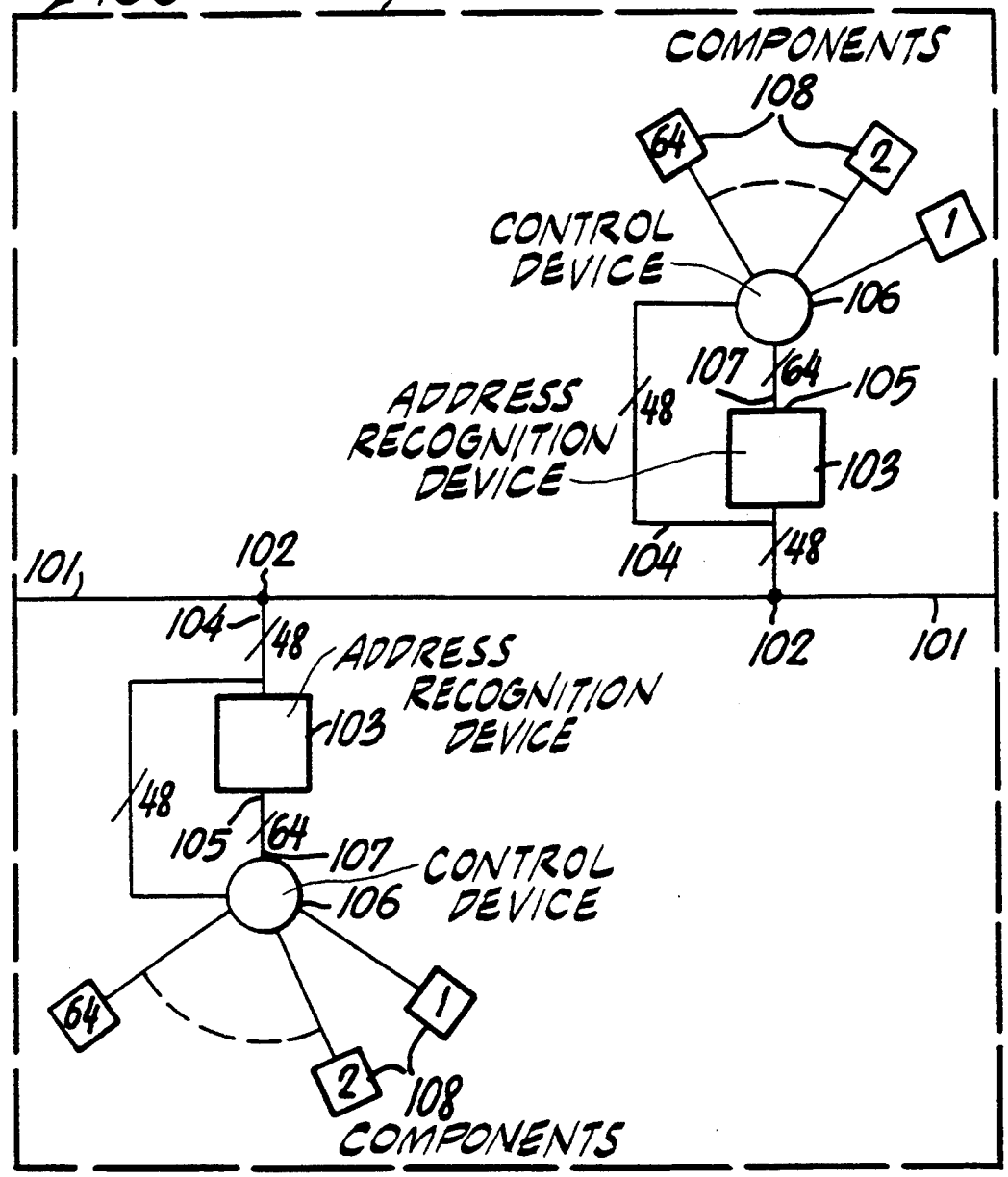
FIG. 1 is a block diagram of a computer network incorporating the content addressable memory of the present invention for use as an address recognition device.

Referring now to the drawings and initially to FIG. 1, there is illustrated a computer network 100. A bus 101 is coupled to nodes 102 of the network 100. At each node 102, a second bus 104 couples the bus 101 to an address recognition device (ARD) 103, shown in more detail in FIGS. 2-5. The address recognition device 103 comprises a content addressable memory according to the present invention. The output 105 of the address recognition device 103 is coupled to a control device (CD) 106 by way of a bus 107 having as many bits as there are data entities to be recognized from among all of the possible addresses that can appear on the bus 101. The second bus 104 is also coupled directly to the control device 106. The control device 106 is coupled to a plurality of components 108, e.g., 64 components. The control device 106 identifies a particular component 108 for reception of a message based upon a unique 48-bit address transmitted on the bus 101 which identifies the particular component 108. The bus 101 and second bus 104 may be serial line busses which transmit, e.g. a 48-bit address one bit at a time into each address recognition device 103.

The bus 101 is used to transmit a message from one component 108 at one node 102 to another component 108 at another node 102. A data entity comprising an address that uniquely identifies the component to receive the message, may be transmitted as, e.g., a header of the message. At each node 102, the input data entity comprising the address header of a message is transmitted via the second bus 104 to the address recognition device 103. Each address recognition device 103 operates to automatically recognize any one of 64 unique addresses, e.g., when there are 64 components of a computer systems, out of the $2^{48}$ possible combinations of the 48-bit input data entity that can be transmitted on the bus 101, i.e., to recognize a sparsely populated matrix. The 64 addresses or data entities to be recognized from the sparsely populated matrix correspond to the components 108 coupled to the address recognition device 103. The address recognition device 103 processes the 48-bit input data entity to generate a mask signal as many bits wide as there are data entities to be recognized.. The mask signal is transmitted to the corresponding control device 106. Each one of the bits of the mask signal corresponds to one component of a computer system. When a component of a computer system has been addressed, match information, appearing as a logic 1, will be transmitted on the corresponding bit, of the 64-bit mask signal. The control device 106 communicates to the component of a computer system 108 corresponding to the set bit of the mask signal that it is to receive the message on the bus 101. The control device 106, which is coupled to the bus 104, then receives the message and transmits the message from the bus 104 to the selected addressed component of a computer system 108.

Figure 2:
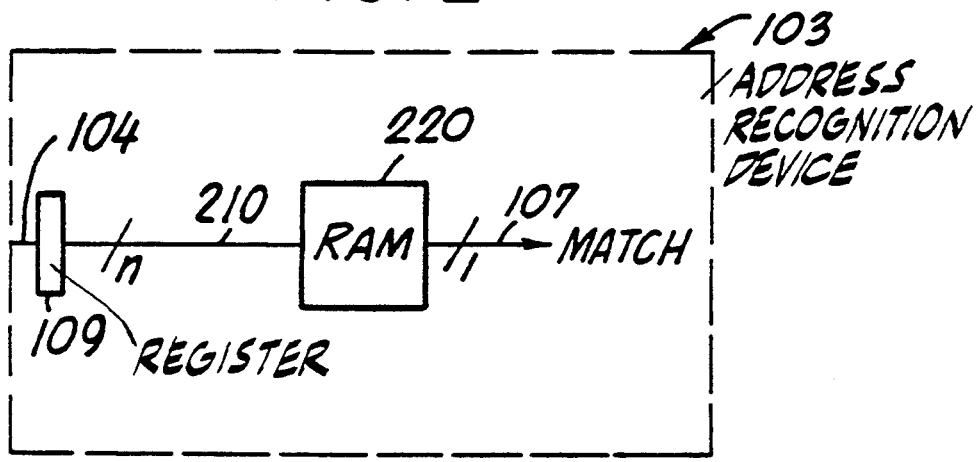
FIG. 2 is a detailed block diagram of an embodiment of the address recognition device of FIG. 1.

Referring now to FIG. 2, there is illustrated an embodiment of the address recognition unit 103 of the invention. An n-bit input data entity is transmitted on bus 104 coupled to a register 109. The n-bit input data entity is loaded into the register 109. The register 109 is coupled by way of an n-bit bus 210 to a RAM 220. The RAM 220 contains $2^n$ address locations, each location containing a preset data entry comprising match information, each location being a predetermined width. The output of the RAM 220 is coupled to a data bus 107 which communicates with a respective control device 106 of a corresponding node 102 (see FIG. 1).

The n-bit input data entity is used as an address, input to access a data entry at a data storage location in the RAM 220 uniquely defined by the n-bit input data entity used as the address. If, for example, each data location is one-bit wide, each one-bit wide data location is initialized so that it contains a one-bit data entry which is either a logic 1 or a logic ∅. A logic 1 indicates that a match has occurred with the input data entity, i.e., the input data entity corresponds to a particular one of the components 108 at the node 102 and is thus a data entity to be recognized. A logic ∅ indicates that no match has occurred.

If there is more than one data entity to be recognized, e.g., if each one of 64 different components 108 at a node 102 has a unique address, and each data entry at each data location is only one-bit wide, the output of the RAM 220 will not indicate which particular data entity has been recognized although the presence of a logic 1 will correctly indicate whether or not a match has occurred.

Where it is desirable to indicate which data entity has been recognized, it may be accomplished by making each data entry and thus each data location within the RAM 220 as many bits wide as there are data entities to be recognized. Thus, if there are x data entities to be recognized, the data entry would be x bits wide.

The RAM is initialized so that a particular bit of the x-bit data storage location which corresponds to a particular data entity to be recognized is set to a logic 1 at the data location which is uniquely addressed by the particular data entity to be recognized.

The data bus 107 coupled to the output of the RAM 220 outputs a mask signal x bits wide, each bit of the mask corresponding to one of the x data entities to be recognized such that the control device 106 can recognize which one of the components 108 at the node 102 is being addressed.

In the example of FIG. 1, the n-bit input data entity is a 48-bit address. The embodiment in FIG. 2 is feasible when the number of bits, n, in the input data entity is small, e.g. 8 bits. The embodiment becomes less feasible as the width of the input data entity increases, e.g. to 48 bits, thus requiring a RAM with $2^{48}$ locations, a physically prohibitive size for a RAM.

Figure 3:
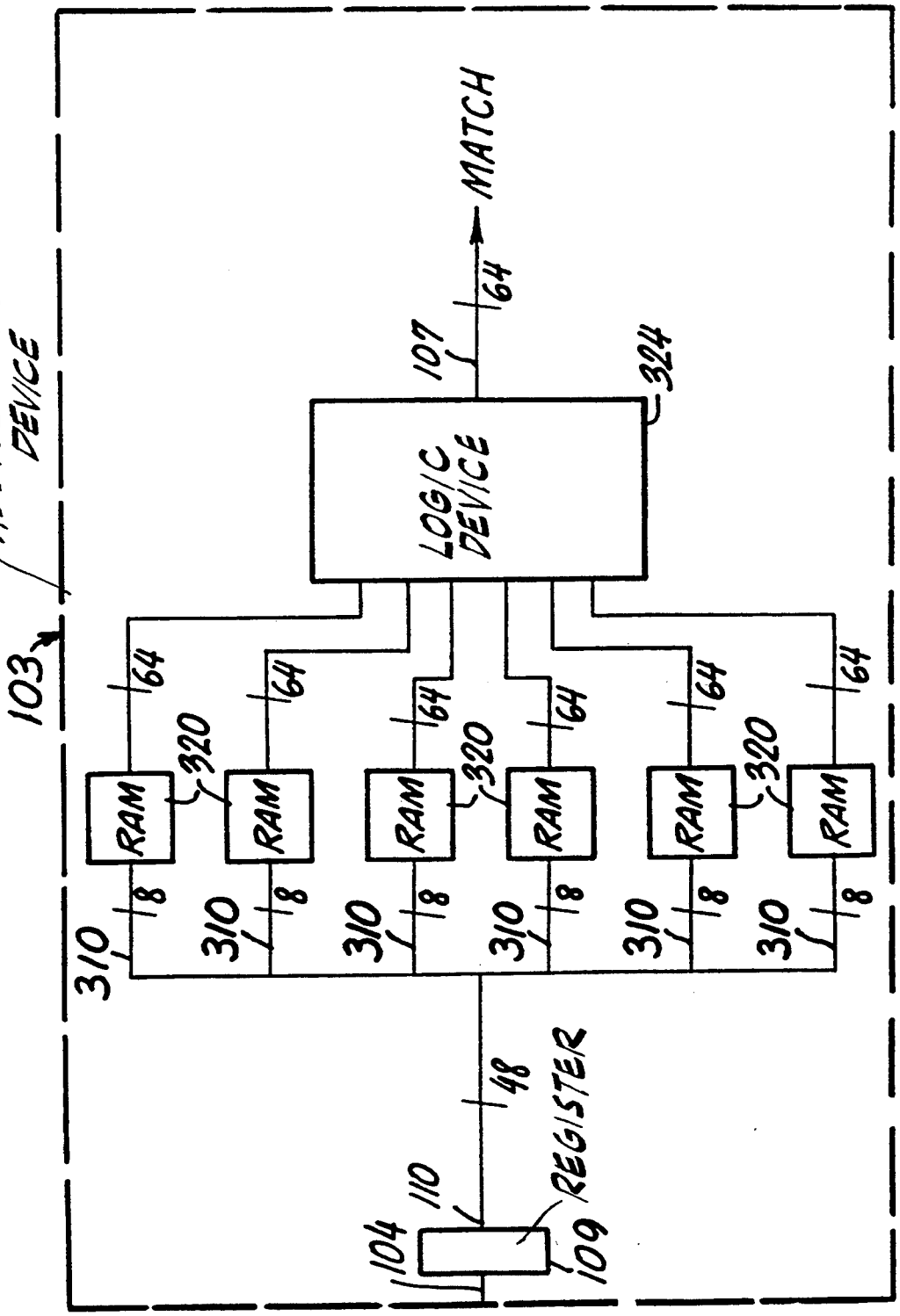
FIG. 3 is a detailed block diagram of another embodiment of the address recognition device of FIG. 1.

Referring now to FIG. 3, there is illustrated a second embodiment of the address recognition unit of the invention. A 48-bit input data entity is transmitted on a bus 104. The bus 104 is coupled to a register 109. The 48-bit input data entity is loaded into the register 109 by way of the bus 104 and may be loaded serially, one bit at a time, into the register 109. The register 109 is coupled to a 48-bit bus 110 which is sliced into six 8-bit buses 310. Each of the 8-bit buses 310 is coupled to a RAM 320 having 256 locations, each location containing a data entry as many bits wide as the number of data entities, x, which are to be recognized, i.e., matched to an input data entity. In the example of FIG. 1, there are 64 data entities to be recognized, thus x=64. The output of each RAM 320 is coupled to a logic device 324 comprising as many 6-input AND gates 324 as there are bits in the data location. The output of each AND gate 324 is coupled to a bus 107, the bus 107 being coupled to the control device 106 of the node 102.

A 48-bit input data entity is transmitted on the 48-bit bus 104 and is loaded into the register 109. The 48-bit input entity is output on the 48-bit bus 110 which is sliced into six 8-bit slices (1 byte) which are each transmitted on a corresponding 8-bit bus 310 to the corresponding RAM 320. Each slice accesses a corresponding data entry at a data location of the corresponding RAM 320.

Each bit of the data entry corresponds to a particular data entity to be recognized. The 6 RAMs are initialized as follows: At each data storage location of each RAM, a data entry which comprises match information and which corresponds to a slice of a particular data entity to be recognized will have a logic 1 at the bit to which the data entity to be recognized corresponds. If a particular slice of an input data entity is to correspond to more than one component on the computer system, the data entry which is uniquely addressed by that slice will have a bit set at logic 1 for each of the corresponding components to be addressed by that slice. The remaining bits are set to logic ∅.

Each particular bit corresponding to a particular data entity to be recognized is transmitted to a corresponding 6-input AND gate 324, each AND gate 324 receiving data from each RAM 320, i.e., each data entry which corresponds to the particular data entity to be recognized. In FIG. 3 the AND gates are represented as a single AND gate logic device 324 for simplicity of illustration. It should be understood that the AND gate logic device 324 comprises, in this example, 64 AND gates.

Figure 4:
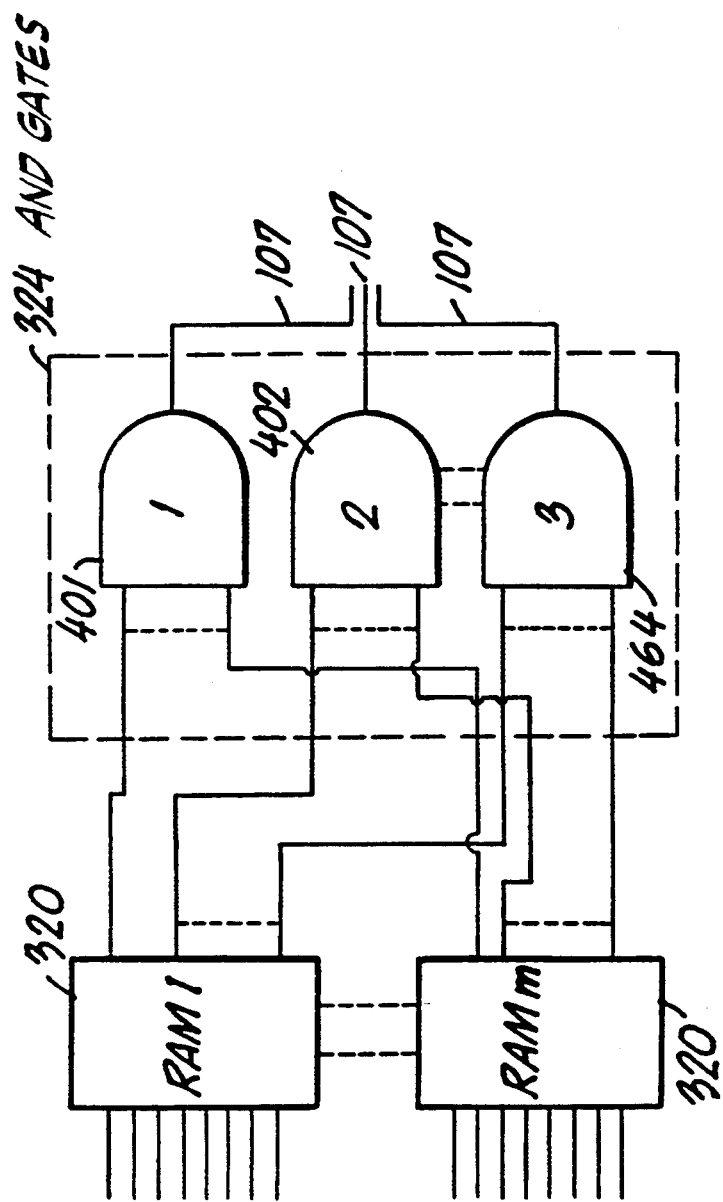
FIG. 4 is a detailed block diagram of the RAM and logic device of FIG. 3.

Referring now to FIG. 4, there is a detailed illustration of the RAM 320 and logic device of FIG. 3. A first bit of each RAM output is coupled to a first AND gate 401, the output of a first AND gate 401 is a first bit of the bus 107. A second bit of each RAM output is coupled to a second AND gate 402, an output of the second AND gate 402 is a second bit of the bus 107, etc. An xth bit of each RAM 320 output is coupled to an xth AND gate 464, an output of the xth AND gate is an xth bit of the bus 107.

The output of each AND gate 324 represents the ANDing of the particular bit of each of the data entries retrieved and output from each RAM in response to input of an input data entity, indicating whether or not a match has occurred for the particular component to be addressed, i.e., data entity to be recognized. The outputs of the AND gates 324 cumulatively form a mask signal having as many bits as there are data entities to be recognized, (in our example, 64). The mask signal is transmitted on the bus 107 to the control device 106 of the node 102. If the input data entity corresponds to an address of one of the components 108 at the respective node 102, the bit of the mask signal corresponding to that component 108 will have a logic 1, which will be processed by the control device 106 to transmit any message on the bus 107 to the designated component 108.

Figure 5:
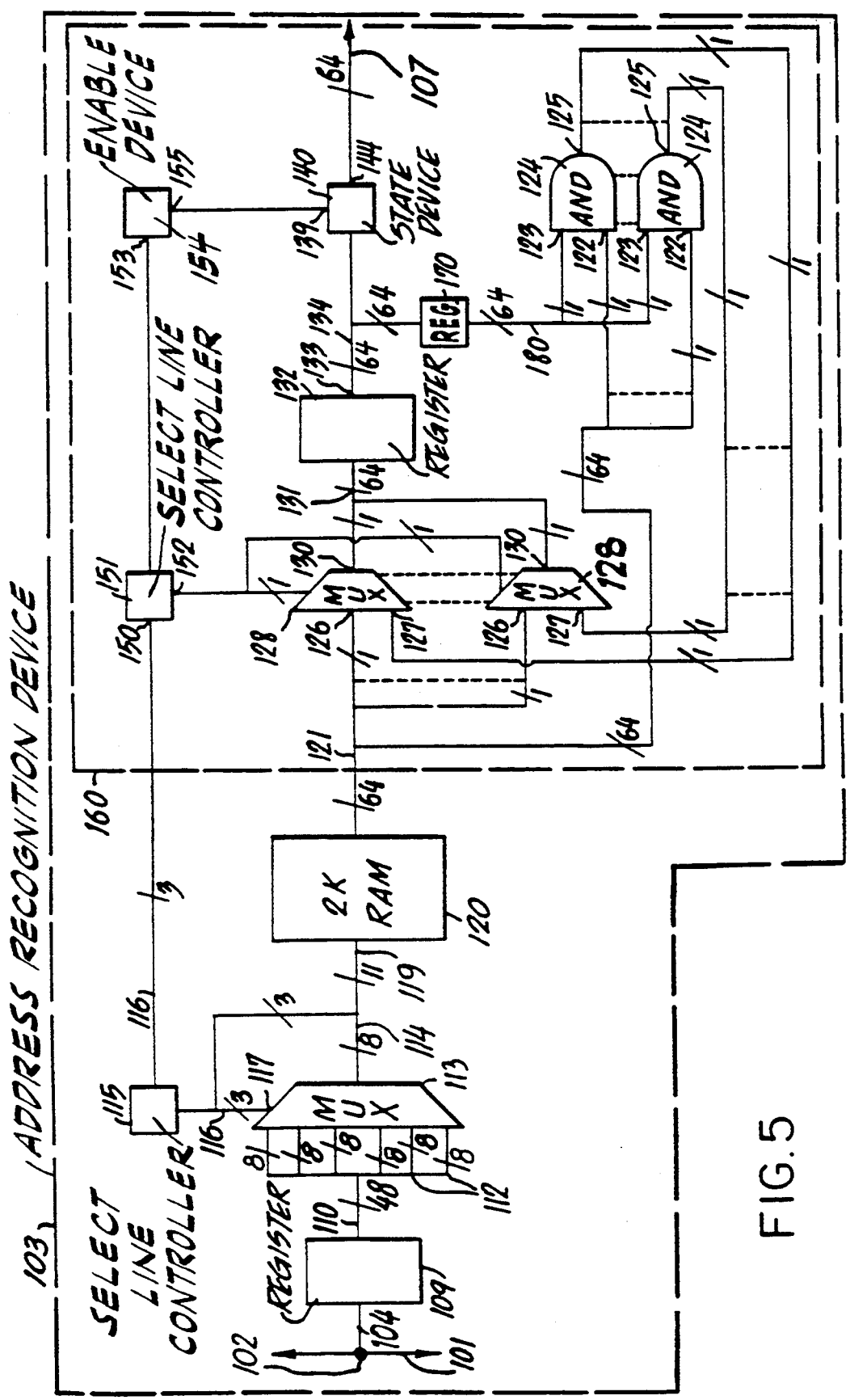
FIG. 5 is a detailed block diagram of a further embodiment of the address recognition device of FIG. 1.

Referring now to FIG. 5, there is a detailed illustration of another embodiment of the address recognition device 103 of FIG. 1. The second bus 104 is coupled to an input of a 48-bit register 109 which temporarily stores the 48-bit input data entity for processing by the address recognition device 103. The output of the register 109 is coupled to a 48-bit bus 110 which divides into six 8-bit buses 112, each 8-bit bus 112 corresponding to one byte of the input data entity, the bytes of the input data entity being numbered 0–5. Each 8-bit bus 112 is coupled to an input of a multiplexer 113. The output of the multiplexer 113 is coupled to an 8-bit bus 114. A select line controller (SLC) 115 is coupled by way of a 3-bit bus 116 to a select line 117 of the multiplexer 113, the select line controller 115 generating a series of 3-bit control signals, one signal per cycle of operation of the address recognition device 103, counting from 0 to 5 in binary to correspond to the 0 to 5 bytes of the data input entity.

The 3-bit control signal output by the select line controller 115 is also concatonated with the 8-bit bus 114, thus forming an 11-bit bus 119 which is coupled to an address input of a 2K RAM 120. The 2K RAM 120 is divided into six location sections, each data location section corresponding to a particular slice of the input data entity and having 256 locations. Each data location is identified uniquely by an 11-bit address comprising the 8 bits of a slice of the input data entity and the 3 bits of the control signal corresponding to the byte number of the byte. The 3-bit signal defines the location section of the RAM. The 8 bits of the signal define the data location within the location section. Thus, each data storage location is defined by an address that comprises an 8-bit number concatonated together with a 3-bit number.

Each data location contains a data entry which comprises a binary number preset during initialization of the RAM. The 2K RAM 120 is initialized as follows: all bits of each 64-bit data location of the RAM 120 are initially set to logic ∅. Each particular components 108 is associated with a bit position of the 64-bit mask. Each data location is accessed by an address 0–255 with an additional 3-bit number designating the location section. The corresponding slice of the 48-bit input data entity designates the specific data storage location within the respective location section. At each data storage location designated by an 11-bit number, a data entry comprising match information is stored. The data entry which corresponds to a byte of at least one particular data entity to be recognized will have a logic 1 at the bit to which the data entity to be recognized corresponds. Thus, the byte of the data entity to be recognized corresponding to a particular component will address a data entry in the RAM which will have the particular bit to which the data entity to be recognized corresponds, initialized to logic 1. If a particular byte of an input data entity will correspond to more than one data entity to be recognized, i.e., component on the computer system, the data entry which is uniquely addressed by that byte will have a corresponding bit set at logic 1 for each of the corresponding components to be addressed by that byte.

The multiplexer 113 serially outputs each byte of the input data entity to the RAM 120, one per cycle, in a sequence determined by the 3-bit control signals input to the select line 117.

Each unique data location of the RAM 120 identified by each 11-bit address is 64-bits wide. Each one of the 64 bits of data corresponds to one of the 64 components 108 at a respective node 102 (see FIG. 1). The output of the RAM 120 is coupled to a 64-bit bus 121 which is coupled to an ANDing logic device 160.

The ANDing logic device 160 comprises the 64-bit bus 121, an array of 64 AND gates 124, and 64 multiplexers 128. Each bit of the bus 121 is coupled to both a corresponding first input 122 of the corresponding AND gate 124 and a corresponding first input 126 of the corresponding second multiplexer 128. The 3-bit bus 116 which is coupled to the output of the select line controller 115 is also coupled to a control input 150 of a second select line controller (SLC) 151. An output 152 of the second select line controller 151 is coupled to a select line 129 which is connected to each of the second multiplexers 128. Each of the second multiplexers 128 has a second-input 127. The first input 126 is selected by the select line controller 151 at the first cycle, i.e. cycle ∅, of a six-cycle clock period, i.e. cycles ∅–5, cycle ∅ corresponding to transmission of byte ∅ of the data entity. The select line controller 151 selects the second input 127 for the remaining cycles 1–5 of the six-cycle clock period. The output 130 of each second multiplexer 129 is connected to a corresponding bit of a second 64-bit bus 131 which is coupled to a 64-bit register 132. The output 133 of the 64-bit register 132 is coupled to a third 64-bit bus 134, and to an input of a state device 140. The third 64-bit bus is connected to a second 64-bit register 170, and the output of the second 64-bit register 170 is coupled to a fourth 64-bit bus 180, the individual lines of which are each coupled to a corresponding one of second inputs 123 of the AND gates 124. Each of the AND gates 124 has a corresponding output 125 which is coupled to corresponding lines of a fifth 64-bit bus 135, each of the bits of which are coupled to a corresponding one of the second inputs 127 of the corresponding second multiplexers 128.

The 3-bit bus 116 is coupled to the input 153 of an enable device 154. The output 155 of the enable device 154 is coupled to an enable port 139 of the state device 140. The output 144 of the state device 140 is coupled to the 64-bit bus 107. When the state device 140 is enabled, the 64-bit output of the register 132 is transmitted on the 64-bit bus 107 as a mask signal to the controller 106 of the node 102. The controller 106 utilizes the information in the 64-bit mask signal to identify messages for any one of the components 108 (see FIG. 1) of the node 102.

When the control signal on the 3-bit bus 116 corresponds to byte ∅, i.e. during a first cycle, the 8 bits comprising byte ∅ of the input data entity are output by the multiplexer 113 and concatenated with the 3-bit control signal to form a first 11-bit address input to the 2K RAM 120.

The 2K RAM 120 operates to output a 64-bit mask signal, corresponding to the 64-bit data entry at the data location identified by the 11-bit address. Each bit of the mask signal is transmitted on a corresponding line of the 64-bit bus 121 to the ANDing logic device 160. The ANDing logic device 160 operates to cumulatively AND together the 64-bit match information which is serially output by the 2K RAM 120. The ANDing logic Device operates as follows: Each bit of the 64-bit bus 121 is coupled to the corresponding first input 122 of the corresponding AND gate 124 and to the corresponding first input 126 of the corresponding second multiplexer 128.

The first input 126 of each second multiplexer 128 is selected at byte ∅ by the second select line controller 150. Thus, the 64-bit mask corresponding to byte ∅ is loaded into the 64-bit register 132 and each bit is transmitted from the 64-bit register 132 to the second 64-bit register 170. The second 64-bit register 170 serves to drive the AND gates and outputs each bit to the corresponding one of the second inputs 123 of the AND gates 124 via the bus 180. At the next cycle, cycle 1, while the second register 170 inputs each bit of the mask from cycle ∅ into each of the second inputs 123 of each respective AND gate 124, the RAM 120 outputs each bit of the 64-bit mask signal from cycle 1 to each of the first inputs 122 of each respective AND gate 124. Thus, for each bit of the 64-bit mask signal which appears as a logic 1 for cycle ∅ and for cycle 1, the corresponding AND gate 124 will output a logic 1.

The output 125 of each AND gate 124 forms a feedback loop to transmit each corresponding bit of the 64-bit mask signal to the corresponding second input 127 of the corresponding second multiplexer 128. Each second input 127 of each second multiplexer 128 is selected by the second select line controller 151 for each of the remaining cycles 1-5 of the operation of the address recognition device 103. Thus, for each of the remaining cycles, the 64-bit mask signal output by the AND gates 124 from a previous cycle is input to the corresponding second inputs 123 of the AND gates 124 via the multiplexer 128, register 132 and second register 170, and compared at the next cycle to a next 64-bit mask signal output by the RAM 120 on bus 121, each bit of which is input to the corresponding first input 122 of the AND gates 124 via the bus 121.

To the extent a particular bit of the 64-bit mask signal input into the corresponding first input 122 of the corresponding AND gate 124 registers a logic 1 and the corresponding bit input into the corresponding second input 123 of the corresponding AND gate 124 by the register 170 also registers a logic 1, a logic 1 will appear at the output 125 of the corresponding AND gate 124 and thus a new 64-bit mask signal will be created comprising matches on each bit of the 64-bit mask signal which has registered a logic 1 at every previous cycle for comparison at the next cycle. As soon as a logic ∅ appears at any one of the 64-bits of any mask signal from a previous cycle, a logic p will carry into the 64-bit register 132 for that bit at every remaining cycle, since a logic ∅ input to the AND gate will not result in a logic 1 output for the compared pair of bits. Thus, where all six bytes of an 48-bit input data entity correspond to a particular component, match information indicating a match will appear on the appropriate corresponding bit for that component throughout the six cycles of comparison.

A final mask signal comprises the final ANDed signal of match information is transmitted from the 64-bit register 132 to the state device 140. The enable device is synchronized by the select line controller 115 which counts for six cycles, the output 116 of the select line controller 115 being connected to the input 153 of the enable device 154. The state device 140 is enabled by the enable device 154 only at the last cycle, cycle 5, and there outputs the final 64-bit mask, the final mask representing the cumulative match information for all six cycles, being output on the 64-bit bus 107.

I claim:
1. A computer system comprising
   a) a bus;
   b) at least one node coupled to the bus;
   c) an address recognition unit coupled to each node; each address recognition unit coupled to a corresponding controller;
   d) at least one component coupled to each address recognition unit via the corresponding controller, each of said at least one component being uniquely identified by a respective one of a plurality of data entities;
   e) said bus transmitting a first one of the plurality of data entities to each of said address recognition units;
   f) each address recognition unit comprising
      i) a content addressable memory input coupled to the bus for inputting one of the plurality of data entities received from the bus, each of the plurality of data entities being divided into n slices;
      ii) an content addressable memory output;
      iii) a RAM coupled to said content addressable memory input, said RAM including a plurality of data storage locations, each of said data storage locations having a unique address and containing one of a plurality of data entries;
      iv) each of the data entries being associated with a certain one of the n slices of one of the plurality of data entities and including predetermined match information for said certain one of the n slices;
      vi) each certain one of the n slices forming at least a portion of the unique address which contains the one of the plurality of data entries associated with said certain one of the n slices;
      vii) said content addressable memory input including a multiplexer, said multiplexer operating to accept as input a first of the plurality of data entities and to serially output each of the n slices of said first of the plurality of data entities;
      viii) said content addressable memory input operating to serially provide n determined addresses to said RAM, wherein each of the n determined addresses corresponds to one of the n slices, and each of the n slices forms at least a portion of the corresponding one of the n determined addresses;
      ix) said RAM having an address port for serially inputting each of the n determined addresses, one determined address per preselected time cycle, as an address and said RAM operating to fetch the one of the plurality of data entries stored at each said address;
      x) said RAM having an output port, said RAM further operating to output each fetched one of the plurality of data entries, each fetched one of the plurality of data entries including predetermined match information for each of the corresponding n slices of said first of the plurality of data entries; and
      xi) said content addressable memory output coupled to said output port, said content addressable memory output operating to output, to the corresponding controller, unique match information for the at least one component corresponding to said first of the plurality of data entities, said unique match information including said each fetched one of the plurality of data entries; and g) said corresponding controller being responsive to the unique match information to couple the first of the plurality of data entities to the at least one component if the identification information indicates that the first of the plurality of data entities is equal to the respective one of the plurality of data entities which uniquely identifies the at least one component.

2. The computer system of claim 1 further comprising a logic device coupled to said RAM;

said RAM operating to serially output the predetermined match information for each of the corresponding n slices of said first of the plurality of data entries to said logic device; and said logic device operating to output a composite mask signal for the n slices of the first of the plurality of data entities.

3. The computer system of claim 2 wherein said logic device comprises means for serially, cumulatively ANDing together the serially output match information corresponding to each of the n slices of the first of the plurality of data entities.

4. A computer system comprising
 a) a bus;
 b) at least one node coupled to the bus;
 c) an address recognition unit coupled to each node, each address recognition unit coupled to a corresponding controller;
 d) at least one component coupled to each address recognition unit via the corresponding controller, each of said at least one component being uniquely identified by a respective one of a plurality of data entities;
 e) said bus transmitting a first one of the plurality of data entities to each of said address recognition units;
 f) each address recognition unit comprising
  i) a content addressable memory input for inputting one of the plurality of data entities, each of the plurality of data entities being divided into n slices;
  ii) a content addressable memory output;
  iii) an array of n RAMs, each having an address input coupled to said content addressable memory input and a data output coupled to said content addressable memory output, wherein
   1) a 1st of the n RAMs includes a 1st plurality of data storage locations uniquely addressable by each of a plurality of 1st slices of a plurality of data entities and containing certain ones of the plurality of data entries, said certain ones comprising predetermined match information for each corresponding one of said plurality of 1st slices; and
   2) a 2-nth of the n RAMs includes a 2-nth plurality of data storage locations uniquely addressable by each of a plurality of 2-nth slices of the plurality of data entities and containing certain ones of the plurality of data entries, said certain ones comprising predetermined match information for each corresponding one of said plurality of 2-nth slices;
  iv) the address recognition unit operating to receive at the content addressable memory input the first one of the plurality of data entities;
  v) the address recognition unit operating to apply the 1st slice of the first one of the plurality of data entities to the address input of the 1st of the n RAMs;
  vi) the 1st of the n RAMs operating to fetch a 1st one of the plurality of data entries corresponding to the 1st slice: of the first of the plurality of data entities;
  vii) the content addressable memory operating to apply the 2-nth slice of the first of the plurality of data entities to the address input of the 2-nth of the n RAMs;
  viii) the 2-nth of the n RAMs operating to fetch an 2-nth one of the plurality of data entries corresponding to the 2-nth slice of the first of the plurality of data entities;
  ix) said content addressable memory output operating to output to the corresponding controller identification information for the at least one component corresponding to said first of the plurality of data entities, said identification information comprising said 1st one of the plurality of data entries and said 2-nth one of the plurality of data entries; and
 g) said corresponding controller being responsive to the identification information to couple the first of the plurality of data entities to the at least one component if the identification information indicates that the first of the plurality of data entities is equal to the respective one of the plurality of data entities which uniquely identifies the at least one component.

5. The computer system of claim 4 wherein
 a) said content addressable memory output comprises at least one n-input AND gate;
 b) said data output of each of said n RAMs is coupled to a respective input of said at least one n-input AND gate, said at least one n-input AND gate having an output comprising a signal of ANDed identification information from each one of said n RAMs; and
 c) said identification information is said signal of ANDed identification information from each one of said n RAMs.

6. The computer system of claim 4 wherein
 each one of said certain ones of the plurality of data entries stored in the array of n RAMs comprises x bits of data, x being equal to a number of unique individual data entities for which match information is stored in the array of n RAMs, each one of said x bits of data corresponding to a respective one of said unique individual data entities.

7. The computer system of claim 6 further comprising a logic device having an input connected to the data output of each of the n RAMs, wherein each data output is an x-bit output;

said logic device operating to AND together predetermined corresponding bits output from said n RAMs; and said logic device having an output coupled to said CAM output and operating to output a mask signal wherein said mask signal indicates match information for the unique individual data entities.

8. The computer system of claim 7 wherein said mask signal comprises an x-bit mask signal, each bit of the x-bit mask corresponding to one of the individual unique data entities.

9. The computer system of claim 8 wherein said logic device comprises an array of x n-input AND gates, each one of the x bits of data output by each one of the n RAMs being input to a respective one of the x n-input AND gates, such that a 1st of the x-bits of data output by a first of the n RAMs is input to a 1st of the n-inputs of a first of the x n-input AND gates and an xth of the x-bits of data output by an nth of the n RAMs is input to an nth of the n-inputs of an xth of the x n-input AND gates each of said x n-input AND gates outputting one bit of the x-bit mask signal indicating match information for said unique individual data entities.

10. An address recognition unit comprising
a content addressable memory input for inputting one of a plurality of data entities,-each of the plurality of data entities being divided into n slices;
each of the plurality of data entities comprising unique identification information for a corresponding one of a plurality of components of a computer system;
a content addressable memory output;
a RAM coupled to said content addressable memory input, said RAM including a plurality of data storage locations, each of said data storage locations having a unique address and containing one of a plurality of data entries;
each of the data entries being associated with a certain one of the n slices of one of the plurality of data entities and including predetermined match information for said certain one of the n slices;
each certain one of the n slices forming at least a portion of the unique address which contains the one of the plurality of data entries associated with said certain one of the n slices;
said content addressable memory input including a multiplexer, said multiplexer operating to accept as input a first of the plurality of data entities and to serially output each of the n slices of said first of the plurality of data entities;
said content addressable memory input operating to serially provide n determined addresses to said RAM, wherein each of the n determined addresses corresponds to one of the n slices, and each of the n slices forms at least a portion of the corresponding one of the n determined addresses;
said RAM having an address port for serially inputting each of the n determined addresses, one determined address per preselected time cycle, as an address and said RAM operating to fetch the one of the plurality of data entries stored at each said address;
said RAM having an output port, said RAM further operating to output each fetched one of the plurality of data entries, each fetched one of the plurality of data entries including predetermined match information for each of the corresponding n slices of said first of the plurality of data entries; and
said content addressable memory output coupled to said output port, said content addressable memory output operating to output unique match information for the one of the plurality of components of the computer system corresponding to said first of the plurality of data entities, said unique match information including said each fetched one of the plurality of data entries.

11. The address recognition unit of claim 10 wherein each one of said certain ones of the plurality of data entries stored in the array of n RAMs comprises x bits of data, x being equal to a number of unique individual data entities for which match information is stored in the array of n RAMs, each one of said x bits of data corresponding to a respective one of said unique individual data entities.

12. The address recognition unit of claim 11 further comprising
a logic device having an input connected to the data output of each of the n RAMs, wherein each data output is an x-bit output;
said logic device operating to AND together predetermined corresponding bits output from said n RAMs; and
said logic device having a logic output coupled to said CAM output and operating to output a mask signal wherein said mask signal indicates match information for the unique individual data entities.

13. The address recognition unit of claim 12 wherein said mask signal comprises an x-bit mask signal, each bit of the x-bit mask corresponding to one of the individual unique data entities.

14. The address recognition unit of claim 13 wherein said logic device comprises an array of x n-input AND gates, each one of the x bits of data output by each one of the n RAMs being input to a respective one of the x n-input AND gates, such that a 1st of the x-bits of data output by a first of the n RAMs is input to a 1st of the n-inputs of a first of the x n-input AND gates and so on in sequence until an xth of the x-bits of data output by an nth of the n RAMs is input to an nth of the n-inputs of an xth of the x n-input AND gates, each of said x n-input AND gates outputting one bit of the x-bit mask signal indicating match information for said unique individual data entities.

15. The address recognition unit of claim 10 further comprising
a logic device coupled to said RAM;
said RAM operating to serially output the predetermined match information for each of the corresponding n slices of said first of the plurality of data entries to said logic device; and
said logic device operating to output a composite mask signal for the n slices of the first of the plurality of data entities.

16. The address recognition unit of claim 15 wherein said logic device comprises means for serially, cumulatively ANDing together the serially output match information corresponding to each of the n slices of the first of the plurality of data entities.

17. An address recognition unit comprising
a content addressable memory input for inputting one of a plurality of data entities, each of the plurality of data entities being divided into n slices;
each one of the plurality of data entities comprising unique identification information for a corresponding one of a plurality of components of a computer system;
an content addressable memory output;
an array of n RAMs, each having an address input coupled to said content addressable memory input and a data output coupled to said content addressable memory output, wherein
a 1st of the n RAMs includes a plurality of data storage locations uniquely addressable by each of a plurality of 1st slices of the plurality of data entities and containing certain ones of the plurality of data entries, said certain ones comprising predetermined match information for each corresponding one of said plurality of 1st slices; and
a 2-nth of the n RAMs includes a plurality of data storage locations uniquely addressable by each of a plurality of 2-nth slices of the plurality of data entities and containing certain ones of the plurality of data entries, said certain ones comprising predetermined match information for each corresponding one of said plurality of 2-nth slices;

the content addressable memory operating to receive at the content addressable memory input a first of the plurality of data entities;

the content addressable memory operating to apply the 1st slice of the first of the plurality of data entities to the address input of the 1st of the n RAMs;

the 1st of the n RAMs operating to fetch a 1st one of the plurality of data entries corresponding to the 1st slice of the first of the plurality of data entities;

the content addressable memory operating to apply the 2-nth slice of the first of the plurality of data entities to the address input of the 2-nth of the n RAMs;

the 2-nth of the n RAMs operating to fetch an 2-nth one of the plurality of data entries corresponding to the 2-nth slice of the first of the plurality of data entities; and said content addressable memory output operating to output unique match information for the one of the plurality of components of the computer system corresponding to said first of the plurality of data entities, said unique match information comprising said 1st one of the plurality of data entries and said 2-nth ones of the plurality of data entries.

18. The address recognition unit of claim 17 wherein
a) said content addressable memory output comprises at least one n-input AND gate; and
b) said data output of each of said n RAMs is coupled to a respective input of said at least one n-input AND gate, said at least one n-input AND gate having an output comprising a signal of ANDed match information from each one of said n RAMs.

19. A content addressable memory comprising
a content addressable memory input for inputting one of a plurality of data entities, each of the plurality of data entities being divided into n slices;
a content addressable memory output;
a RAM coupled to said content addressable memory input, said RAM including a plurality of data storage locations, each of said data storage locations having a unique address and containing one of a plurality of data entries;
each of the data entries being associated with a certain one of the n slices of one of the plurality of data entities and including predetermined match information for said certain one of the n slices;
each certain one of the n slices forming at least a portion of the unique address which contains the one of the plurality of data entries associated with said certain one of the n slices;
said content addressable memory input including a multiplexer, said multiplexer operating to accept as input a first of the plurality of data entities and to serially output each of the n slices of said first of the plurality of data entities;
said content addressable memory input operating to serially provide n determined addresses to said RAM, wherein each of the n determined addresses corresponds to one of the n slices, and each of the n slices forms at least a portion of the corresponding one of the n determined addresses;

said RAM having an address port for serially inputting each of the n determined addresses, one determined address per preselected time cycle, as an address and said RAM operating to fetch the one of the plurality of data entries stored at each said address; and said RAM further operating to output to the content addressable memory each fetched one of the plurality of data entries, each fetched one of the plurality of data entries including predetermined match information for each of the corresponding n slices of said first of the plurality of data entities; and the content addressable memory output outputting the predetermined match information.

20. The content addressable memory of claim 19 further comprising
a logic device coupled to said RAM;
said RAM operating to serially output the predetermined match information for each of the corresponding n slices of said first of the plurality of data entries to said logic device; and
said logic device operating to output a composite mask signal for the n slices of the first of the plurality of data entities.

21. The content addressable memory of claim 20 wherein said logic device comprises means for serially, cumulatively ANDing together the serially output match information corresponding to each of the n slices of the first of the plurality of data entities.

22. A content addressable memory comprising
a content addressable memory input, for inputting one of a plurality of data entities, each of the plurality of data entities being divided into n slices;
a content addressable memory output;
an array of n RAMs, each having an address input coupled to said content addressable memory input and a data output coupled to said content addressable memory output, wherein
a 1st of the n RAMs includes a plurality of data storage locations uniquely addressable by each of a plurality of 1st slices of the plurality of data entities and containing certain ones of the plurality of data entries, said certain ones including predetermined match information for each corresponding one of said plurality of 1st slices; and
a 2-nth of the n RAMs includes a plurality of data storage locations uniquely addressable by each of a plurality of 2-nth slices of the plurality of data entities and containing certain ones of the plurality of data entries, said certain ones including predetermined match information for each corresponding one of said plurality of 2-nth slices;

the content addressable memory operating to receive at the content addressable memory input a first of the plurality of data entities;

the content addressable memory operating to apply the 1st slice of the first of the plurality of data entities to the address input of the 1st of the n RAMs;

the 1st of the n RAMs operating to fetch a 1st one of the plurality of data entries corresponding to the 1st slice of the first of the plurality of data entities;

the content addressable memory operating to apply the 2-nth slice of the first of the plurality of data entities to the address input of the 2-nth of the n RAMs;

the 2-nth of the n RAMs operating to fetch an 2-nth one of the plurality of data entries corresponding to the 2-nth slice of the first of the plurality of data entities;

said content addressable memory output operating to output said 1st one of the plurality of data entries and said 2-nth one of the plurality of data entries said content addressable memory output including at least one n-input AND gate; and said data output of each of said n RAMs is coupled to a respective input of said at least one n-input AND gate, said at least one n-input AND gate having an output comprising a signal of ANDed match information from each one of said n RAMs.

23. The content addressable memory of claim 22 wherein each one of said certain ones of the plurality of data entries stored in the array of n RAMs comprises x bits of data, x being equal to a number of unique individual data entities for which match information is stored in the array of n RAMs, each one of said x bits of data corresponding to a respective one of said unique individual data entities.

24. The content addressable memory of claim 23 further comprising a logic device having an input connected to the data output of each of the n RAMs, wherein each data output is an x-bit output;

said logic device operating to AND together predetermined corresponding bits output from said n RAMs; and said logic device having an output coupled to said CAM output and operating to output a mask signal wherein said match information for the unique individual data entities.

25. The content addressable memory of claim 24 wherein said mask signal comprises an x-bit mask signal, each bit of the x-bit mask corresponding to one of the individual unique data entities.

26. The content addressable memory of claim 25 wherein said logic device comprises an array of x n-input AND gates, each one of the x bits of data output by each one of the n RAMs being input to a respective one of the x n-input AND gates, such that a 1st of the x-bits of data output by a first of the n RAMs is input to a 1st of the n-inputs of a first of the x n-input AND gates and so on in sequence with an xth of the x-bits of data output by an nth of the n RAMs input to an nth of the n-inputs of an xth of the x n-input AND gates each of said x n-input AND gates outputting one bit of the x-bit mask signal indicating match information for said unique individual data entities.

27. A content addressable memory comprising an input, coupled to a RAM, for receiving one of x unique individual data entities, each of the x unique individual data entities being divided into n slices;

the input including a multiplexer;

the RAM including a plurality of data storage locations, each of said data storage locations having a unique address;

the unique address of each of said data storage locations comprising one of the n slices of one of the x unique individual data entities;

a data entry stored in each one of said data storage locations for providing match information for the one of the n slices of one of x unique individual data entities corresponding to each data storage location;

each data entry comprising x bits of data, x being the number of unique individual data entities;

each one of said x bits of each of said data entries comprising predetermined match information for corresponding particular one of the x unique individual data entities;

said RAM having an address port, coupled to the multiplexer for input of one of the n slices of one of the x unique individual data entities to the RAM as an address; and said RAM having an x-bit output port for output of match information corresponding to one of the n slices of one of the x unique individual data entities, in response to input of the one of the n slices of one of the unique individual data entities to the address port said RAM;

the input operating to receive a first of the M unique individual data entities and to apply said first data entity to the multiplexer;

said multiplexer operating to serially input each of the n slices of the first data entity, one of the n slices per preselected time cycle, to the address port of the RAM; and said RAM operating to access corresponding match information for each one of the n slices, one match information per preselected time cycle.

28. The content addressable memory of claim 27 wherein said content addressable memory further comprises a logic device coupled to said x-bit output port;

said x-bit output port operating to serially output said corresponding match information, one per preselected time cycle, to the logic device;

said logic device operating to serially cumulatively AND together the serially output match information corresponding to each of the n slices and to output composite match information comprising an x-bit mask signal.

29. The content addressable memory of claim 28 wherein said logic device comprises:

an array of x multiplexers, each of said multiplexers including a first input, a second input and an output, each of said first inputs being coupled to a respective bit of said x-bit output of said RAM;

an array of x AND gates, each of said AND gates having a first-AND input coupled to a respective output of a respective one of said array of x multiplexers, each of said AND gates having a second-AND input coupled to a respective bit of said x-bit output of said RAM;

each of said x AND gates having an output coupled to a respective second input of a respective one of said array of x multiplexers;

each of said first inputs of said array of x multiplexers being selected at a first preselected time cycle, each of said second inputs of said array of x multiplexers being selected at each subsequent preselected time cycle, each of said first and subsequent preselected time cycles corresponding to input of a particular one of the n slices of the data entity.

30. An address recognition unit comprising an input, coupled to a RAM, for receiving one of x unique individual data entities, each of the x unique individual data entities being divided into n slices; the input including a multiplexer;

the RAM including a plurality of data storage locations, each of said data storage locations having a unique address;

the unique address of each of said storage locations comprising one of the n slices of one of the x unique individual data entities;

a data entry stored in each one of said data storage locations for providing identification information for the one of the n slices of one of x unique individual data entities corresponding to each data storage location;

each data entry comprising x bits of data, x being the number of unique individual data entities;

each one of said x bits of each of said data entry comprising predetermined identification information for a corresponding particular one of the x unique individual data entities;

said RAM having an address port, coupled to the multiplexer for input of one of the n slices of one of the x unique individual data entities to the RAM as an address; and said RAM having an x-bit output port for output of match information corresponding to one of the n slices of one of the x unique individual data entities, in response to input of the one of the n slices of one of the x unique individual data entities as an address to said RAM;

the input operating to receive a first of the x unique individual data entities and to apply said first data entity to the multiplexer;

said multiplexer operating to serially input each of the n slices of the first data entity, one of the n slices per preselected time cycle, to the RAM as an address; and said RAM operating to access corresponding identification information for each one of the n slices, one match information per preselected time cycle.

31. The address recognition unit of claim 30 wherein said address recognition unit further comprises a logic device coupled to said x-bit output port said x-bit output port operates to serially output said corresponding identification information, one per preselected time cycle, to the logic device;

said logic device operating to serially cumulatively AND together the serially output identification information corresponding to each of the n slices and to output composite identification information comprising an x-bit mask signal.

32. The address recognition unit of claim 31 wherein said logic device comprises:

an array of x multiplexers, each of said multiplexers including a first input, a second input and an output, each of said first inputs being coupled to a respective bit of said x-bit output of said RAM;

an array of x AND gates, each of said AND gates having a first-AND input coupled to a respective output of a respective one of said array of x multiplexers, each of said AND gates having a second-AND input coupled to a respective bit of said x-bit output of-said RAM;

each of said x AND gates having an output coupled to a respective second input of a respective one of said array of x multiplexers;

each of said first inputs of said array of x multiplexers being selected at a first preselected time cycle, each of said second inputs of said array of x multiplexers being selected at each subsequent preselected time cycle, each of said first and subsequent preselected time cycles corresponding to input of a particular one of the n slices of the data entity.

33. A computer system comprising
a) a bus;
b) at least one node coupled to the bus;
c) an address recognition unit coupled to each node, each address recognition unit coupled to a corresponding controller;
d) at least one component coupled to each address recognition unit via the corresponding controller, each of said at least one component being uniquely identified by a respective one of a plurality of data entities;
e) said bus transmitting a first one of the plurality of data entities to each address recognition unit;
f) each address recognition unit comprising
   i) a RAM including a plurality of data storage locations, each of said data storage locations having a unique address and containing one of a plurality of data entries;
   ii) each of the data entries being associated with at least a portion of one of the plurality of data entities and including predetermined identification information for said at least a portion of one of the plurality of data entities;
   iii) each at least a portion of one of the plurality of data entities including said unique address of the data storage location containing the associated one of the data entries;
   iv) said RAM having an address port coupled to the bus, said address port operating to input at least a portion of the first of the plurality of data entities received from the bus to the RAM as an address and said RAM operating to fetch the one of the plurality of data entries stored at said address; and
   v) said RAM having an output port, said output port operating output the predetermined identification information included in the fetched data entry to the corresponding controller; and
g) said corresponding controller being responsive to the identification information to couple the first of the plurality of data entities to the at least one component if the identification information indicates that the first of the plurality of data entities is equal to the respective one of the plurality of data entities which unique identifies the at least one component.

34. A computer system comprising
a) a bus;
b) at least one noble coupled to the bus;
c) an address recognition unit coupled to each node; each address recognition unit coupled to a corresponding controller;
d) at least one component coupled to each address recognition unit via the corresponding controller, each of said at least one component being uniquely identified by a respective one of x unique individual data entities;
e) said bus transmitting a first one of the x unique individual data entities to each of said address recognition units;
f) each address recognition unit comprising a RAM including a plurality of data storage locations, each of said data storage locations having a unique address;

the unique address of each of said storage locations comprising at least a portion of one of the x unique individual data entities;

a data entry stored in each one of said data storage locations for providing identification information for the at least a portion of one of the x unique individual data entities corresponding to each data storage location;

each data entry comprising x bits of data, x being the number of unique individual data entities;

each one of said x bits of each of said data entries comprising predetermined identification information for a corresponding particular data entity;

said RAM having an address port coupled to the bus;

said RAM operating to accept as input at said address port at least a portion of the first one of the data entities received from the bus as an address;

said RAM having an x-bit output coupled to the corresponding controller;

said RAM operating to output to the corresponding controller identification information corresponding to the at least a portion of the first one of the data entities, in response to input of the at least a portion of the first one of the data entities as an address to said RAM, g) said corresponding controller being responsive to the identification information to couple the first of the plurality of data entities to the at least one component if the identification information indicates that the first of the plurality of data entities is equal to the respective one of the plurality of data entities which uniquely identifies the at least one component.

35. A computer system comprising
a) a bus;
b) at least one node coupled to the bus;
c) an address recognition unit coupled to each node; each address recognition coupled to a corresponding controller;
d) at least one component coupled to each address recognition unit via the corresponding controller, each of said at least one component being uniquely identified by a respective one of x unique individual data entities;
e) said bus transmitting a first one of the x unique individual data entities to each of said address recognition units;
f) each address recognition unit comprising
   i) an input, coupled to a RAM and the bus, for receiving one of the x unique individual data entities from the bus, each of the x unique individual data entities being divided into n slices;
   ii) the input including a multiplexer;
   iii) the RAM including a plurality of data storage locations, each of said data storage locations having a unique address;
   iv) the unique address of each of said storage locations comprising one of the n slices of one of the x unique individual data entities;
   v) a data entry stored in each one of said data storage locations for providing identification information for the one of the n slices of one of x unique individual data entities corresponding to each data storage location;
   vi) each data entry comprising x bits of data, x being the number of unique individual data entities;
   vii) each one of said x bits of each of said data entries comprising predetermined identification information for a corresponding particular one of the x unique individual data entities;
   viii) said RAM having an address port, coupled to the multiplexer, for input of one of the n slices of one of the x unique individual data entities to the RAM as an address; and
   ix) said RAM having an x-bit output port, coupled to the corresponding controller, for output of match information corresponding to one of the n slices of one of the x unique individual data entities, in response to input of the one of the n slices of one of the x unique individual data entities as an address to said RAM;
   x) the input means operating to receive a first of the x unique individual data entities from the bus and to apply said first data entity to the multiplexer;
   said multiplexer operating to serially input each of the n slices of the first data entity, one of the n slices per preselected time cycle, to the RAM as an address; and
   xi) said RAM operating to access corresponding identification information for each one of the n slices, one match information per preselected time cycle and to output said corresponding identification information to the corresponding controller; and
g) said corresponding controller being responsive to the identification information to couple the first of the plurality of data entities to the at least one component if the identification information indicates that the first of the plurality of data entities is equal to the respective one of the plurality of data entities which uniquely identifies the at least one component 36. The computer system of claim 35 wherein each said address recognition unit further comprises
a logic device coupled to said x-bit output port
said x-bit output port operates to serially output said corresponding identification information, one per preselected time cycle, to the logic device;
said logic device operating to serially cumulatively AND together the serially output identification information corresponding to each of the n slices and to output composite identification information comprising an x-bit mask signal to the corresponding controller.

37. The computer system of claim 36 wherein said logic device comprises:
an array of x multiplexers, each of said multiplexers including a first input, a second input and an output, each of said first inputs being coupled to a respective bit of said x-bit output of said RAM;
an array of x AND gates, each of said AND gates having a first-AND input coupled to a respective output of a respective one of said array of x multiplexers, each of said AND gates having a second-AND input coupled to a respective bit of said x-bit output of said RAM;
each of said X AND gates having an output coupled to a respective second input of a respective one of said array of x multiplexers;
each of said first inputs of said array of x multiplexers being selected at a first preselected time cycle, each of said second inputs of said array of x multiplexers being selected at each subsequent preselected time cycle, each of said first and subsequent preselected time cycles corresponding to input of a particular slice of the data entity.

* * * * *